US 12,004,297 B2

(12) United States Patent
Chen et al.

(10) Patent No.: US 12,004,297 B2
(45) Date of Patent: Jun. 4, 2024

(54) CAMERA MODULE AND ELECTRONIC DEVICE HAVING THE SAME

(71) Applicant: TRIPLE WIN TECHNOLOGY(SHENZHEN) CO. LTD., Shenzhen (CN)

(72) Inventors: Shin-Wen Chen, New Taipei (TW); Zhuang-Zhuang Jing, Tianjin (CN); Jing-Wei Li, Guangdong (CN); Shuai-Peng Li, Shenzhen (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 92 days.

(21) Appl. No.: 17/944,348

(22) Filed: Sep. 14, 2022

(65) Prior Publication Data
US 2023/0389180 A1  Nov. 30, 2023

(30) Foreign Application Priority Data
May 27, 2022 (CN) .......................... 202210594802.4

(51) Int. Cl.
| H05K 1/14 | (2006.01) |
| H04M 1/02 | (2006.01) |
| H04N 23/68 | (2023.01) |
| H05K 1/02 | (2006.01) |
| H05K 1/18 | (2006.01) |

(52) U.S. Cl.
CPC .......... *H05K 1/144* (2013.01); *H04M 1/0264* (2013.01); *H04N 23/687* (2023.01); *H05K 1/0274* (2013.01); *H05K 1/18* (2013.01); *H05K 2201/041* (2013.01); *H05K 2201/10121* (2013.01)

(58) Field of Classification Search
None
See application file for complete search history.

(56) References Cited

U.S. PATENT DOCUMENTS

| 2014/0055670 A1* | 2/2014 | Hongo | .................. H04N 23/54 348/374 |
| 2022/0232165 A1 | 7/2022 | Huang et al. | |

FOREIGN PATENT DOCUMENTS

TW   I759114 B   3/2022

* cited by examiner

*Primary Examiner* — Mark T Monk
(74) *Attorney, Agent, or Firm* — ScienBiziP, P.C.

(57) ABSTRACT

A dustproof member includes a base plate, a dustproof plate, and a connecting portion. A first through hole is defined by an inner surface of the base plate. A second through hole is defined by an inner surface of the dustproof plate. The connecting portion has a shape of a hollow barrel and defines a hollow cavity. Two opposite ends of the connecting portion are respectively connected to an end of the inner surface of the base plate and an end of the inner surface of the dustproof plate, thereby forming a dust collecting groove between the base plate and the dustproof plate. A camera module having the dustproof member and an electronic device having the camera module are also provided.

20 Claims, 9 Drawing Sheets

CAMERA MODULE AND ELECTRONIC DEVICE HAVING THE SAME

FIELD

The subject matter herein generally relates to a camera module and an electronic device having the camera module.

BACKGROUND

Due to the interference of the physiological vibration of the human body or the external vibration on the portable mobile terminal, when the portable mobile terminal is used to take pictures or videos, the camera module will be disturbed by the above factors and shake, which affects the imaging quality.

Therefore, there is room for improvement within the art.

BRIEF DESCRIPTION OF THE DRAWINGS

Implementations of the present disclosure will now be described, by way of embodiments, with reference to the attached figures.

DETAILED DESCRIPTION

Figure 1:
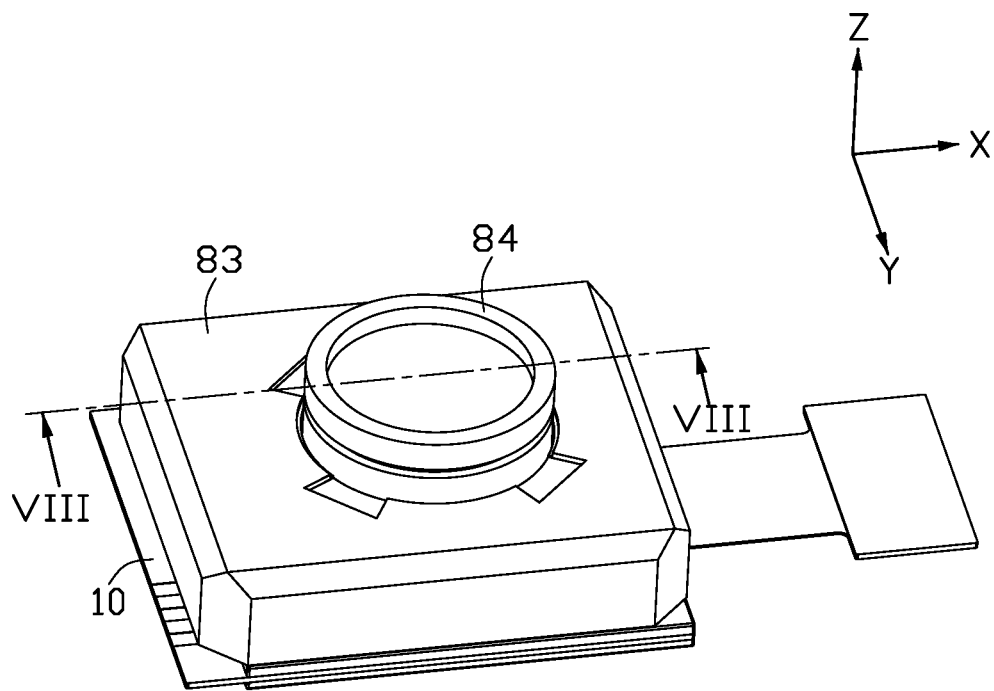
FIG. 1 is a diagram of an embodiment of a camera module according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
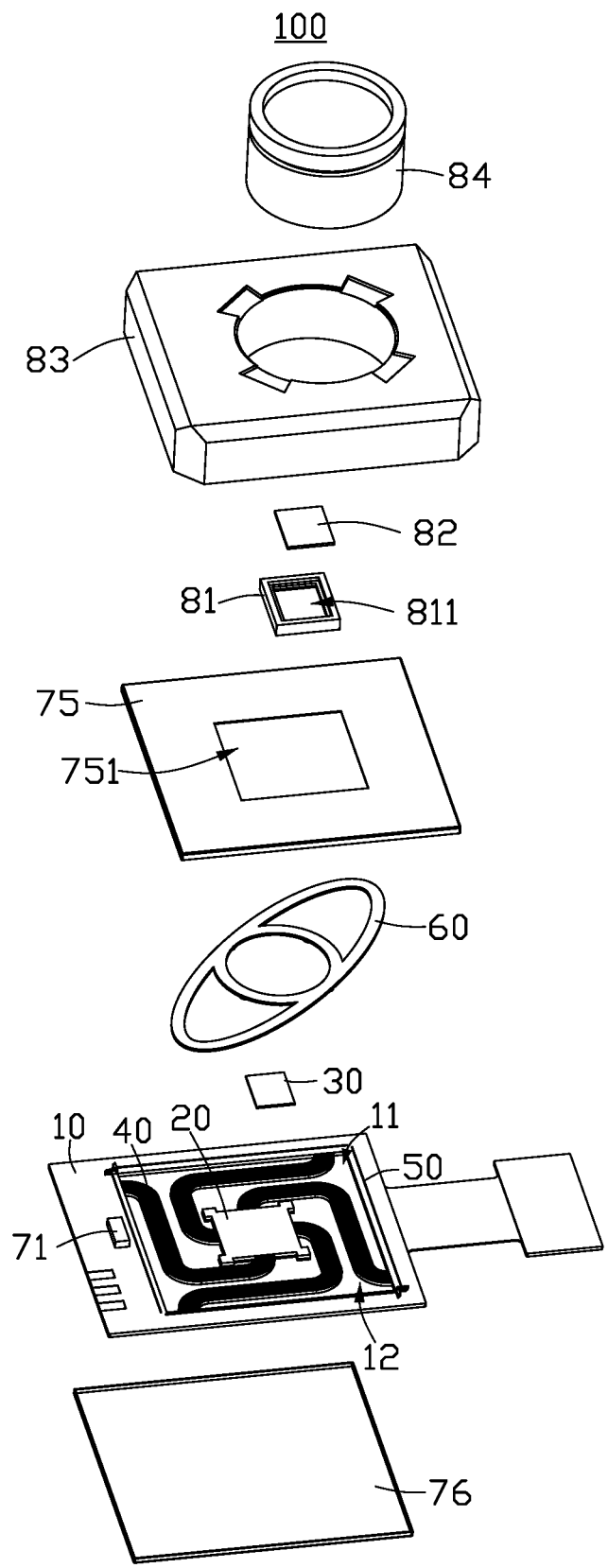
FIG. 2 is an exploded, diagrammatic view of an embodiment of a camera module according to the present disclosure.

FIG. 1 illustrates a first embodiment of a camera module 100. Referring to FIGS. 1 and 2, the camera module 100 includes a first circuit board 10, a second circuit board 20, a photosensitive chip 30, an electrical connecting assembly 40, a memory metal wire assembly 50, and a lens 84. The first circuit board 10 includes an inner surface 110 to define a through groove 11. The through groove 11 penetrates opposite sides of the first circuit board 10. The second circuit board 20 is received in the through groove 11, and a gap 12 is formed to space the second circuit board 20 from the inner surface 110 of the first circuit board 10. The photosensitive chip 30 is mounted on the second circuit board 20 and is electrically connected to the second circuit board 20. The electrical connecting assembly 40 is located in the gap 12 and is electrically connected to the first circuit board 10 and the second circuit board 20. The memory metal wire assembly 50 is mounted on the first circuit board 10 and is electrically connected to the first circuit board 10. The lens 84 is fixed on the first circuit board 10, and a central axis of the through groove 11 coincides with an optical axis of the lens 84. The memory metal wire assembly 50 surrounds the through groove 11. The memory metal wire assembly 50 is also electrically connected to the second circuit board 20 (shown in FIG. 6), and is used to drive the second circuit board 20 and the electrical connecting assembly 40 to move in a plane perpendicular to a third direction Z. A stacking direction of the second circuit board 20 second circuit board 20 and the photosensitive chip 30 is defined as the third direction Z.

When the camera module 100 is working, id the first circuit board 10 drives the lens 84 to shake, the memory metal wire assembly 50 drives the second circuit board 20 to drive the photosensitive chip 30 to move in the plane perpendicular to the third direction Z, so that a moving direction of the photosensitive chip 30 is consistent with a shaking direction of the lens 84, and the optical axis of the lens 84 coincides with a central axis of the photosensitive chip 30. As a result, the shake of the lens is compensated, and the image quality of the camera module 100 is improved.

Figure 3:
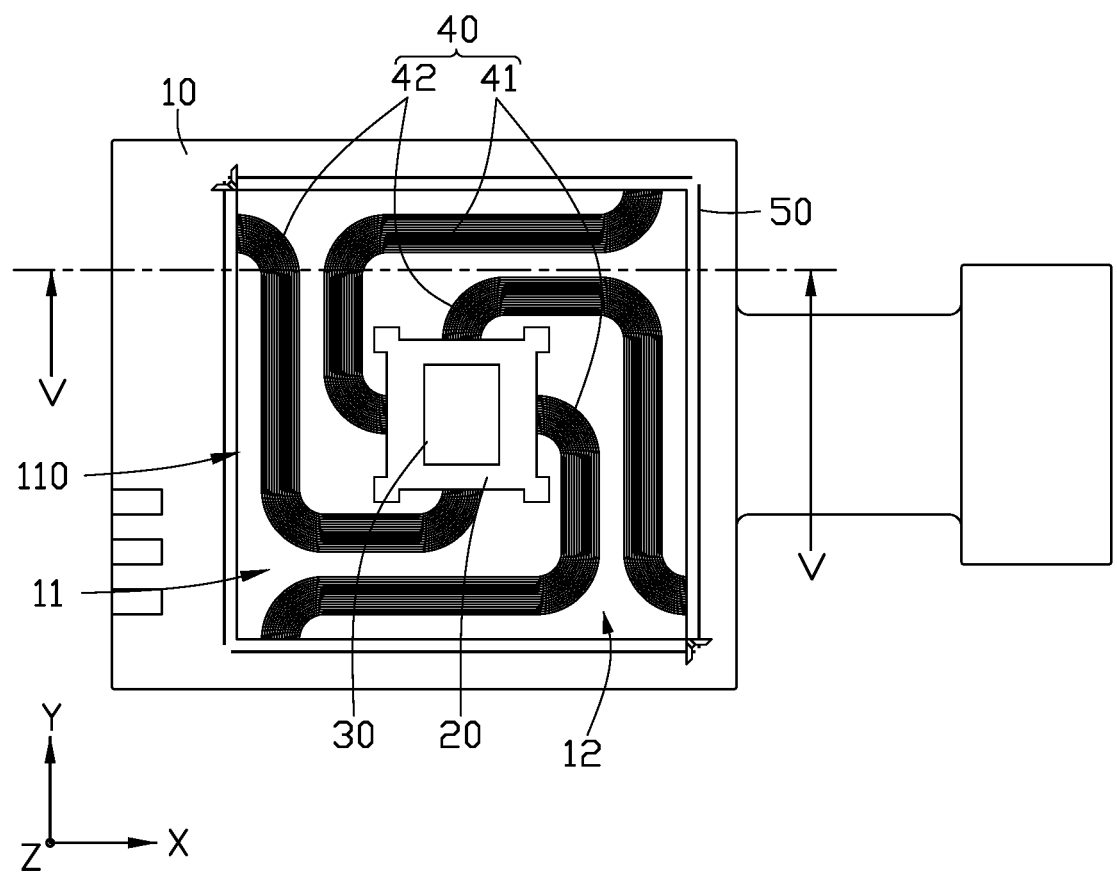
FIG. 3 is a diagram of an embodiment of a partial structure of a camera module according to the present disclosure.
Figure 4:
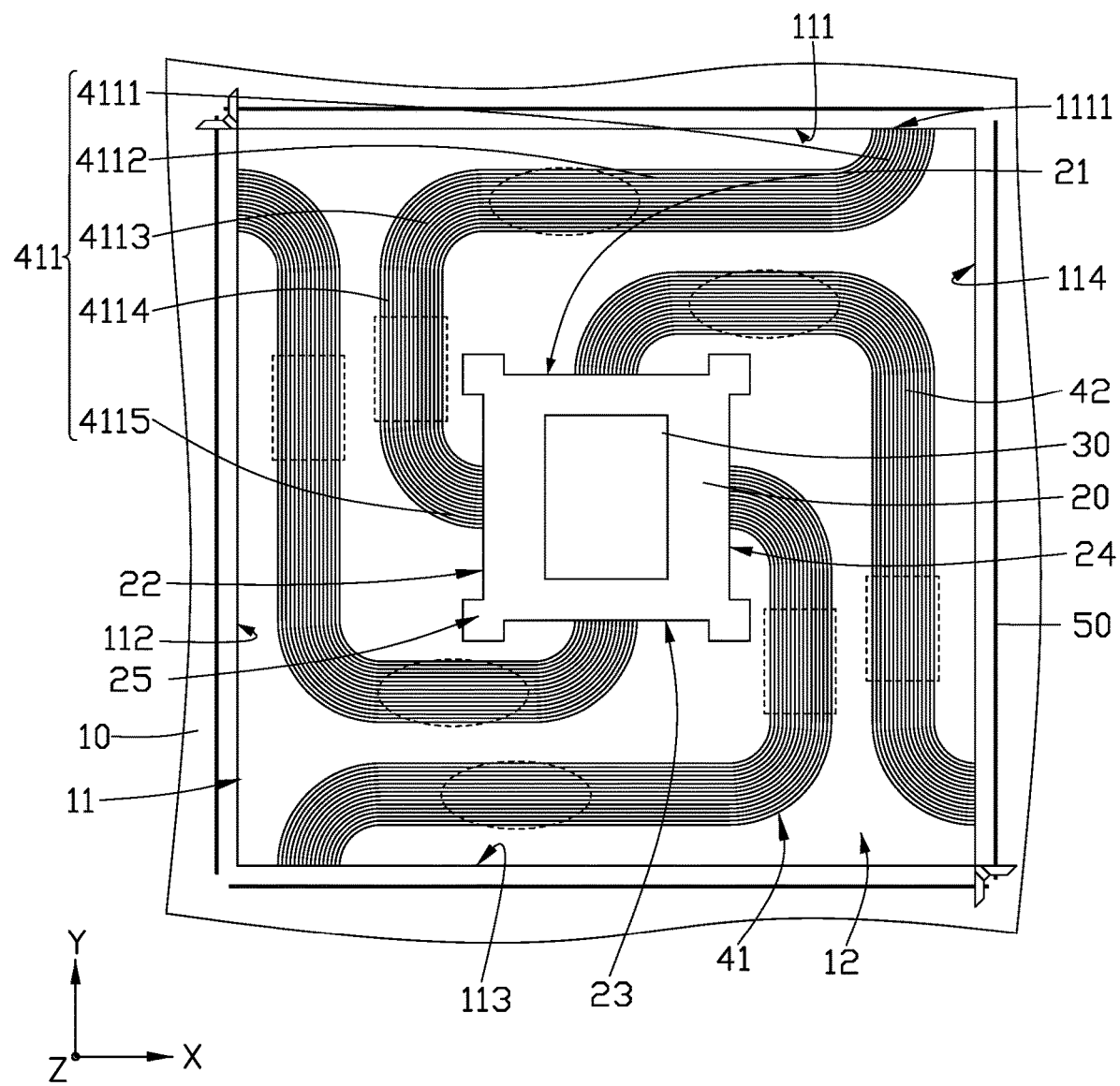
FIG. 4 is a partial enlarged schematic view of the partial structure of a camera module of FIG. 3.

Referring to FIGS. 3 and 4, the second circuit board 20 is substantially square, and the second circuit board 20 includes a first side surface 21, a second side surface 22, a third side surface 23, and a fourth side surface 24. The second side surface 22 and the third side surface 23 are both connected between the first side surface 21 and the fourth side surface 24. The second side surface 22 may be parallel to the fourth side surface 24. The third side surface 23 may be parallel to the first side surface 21. A direction perpendicular to the second side surface 22 and the fourth side surface 24 is defined as a first direction X. A direction perpendicular to the first side surface 21 and the third side surface 23 is defined as a second direction Y. The first direction X, the second direction Y, and the third direction Z are perpendicular to each other. A plane where the photosensitive chip 30 is located is parallel to a plane where the first direction X and the second direction Y are located.

Referring to FIGS. 2, 3, and 4, the electrical connecting assembly 40 includes two center-symmetrical first connecting members 41 and two center-symmetrical second connecting members 42. Each of the first connecting members 41 is connected to the second side surface 22 of the second circuit board 20 and the fourth side surface 24 of the second circuit board 20. Each of the second connecting members 42 is connected to the first side surface 21 of the second circuit board 20 and the third side surface 23 of the second circuit board 20. The electrical connecting assembly 40 is electrically connected to the photosensitive chip 30 through the second circuit board 20.

When the memory metal wire assembly 50 drives the second circuit board 20 to move along the first direction X or along the second direction Y, the first connecting members 41 and the second connecting members 42 improve a stability of the movement of the circuit board 20, thereby preventing the second circuit board 20 from tilting or offsetting when the second circuit board 20 moves.

Referring to FIGS. 3 and 4, each of the first connecting member 41 and the second connecting member 42 has at least three bent portions. When the photosensitive chip 30 moves along the first direction X or the second direction Y, due to the at least three bent portions, both the first connecting members 41 and the second connecting members 42 are easily elastically deformed, so that the photosensitive chip 30 is easier to be driven by the memory metal wire assembly 50. The resistance when the memory metal wire assembly 50 drives the second circuit board 20 to move is reduced, and the flexibility of the memory metal wire assembly 50 to drive the photosensitive chip 30 is improved.

Specifically, the first connecting member 41 includes a plurality of metal strips 411 arranged at intervals. Each of the plurality of metal strips 411 includes a first bent portion 4111, a first movable portion 4112, a second bent portion 4113, a second movable portion 4114, and a third bent portion 4115 which are connected in that sequence. The first bent portion 4111 is connected to the inner surface 110 of the first circuit board 10. The first movable portion 4112 is arranged along the first direction X. The second bent portion 4113 is connected to the first movable portion 4112 and the second movable portion 4114. The second movable portion 4114 is arranged along the second direction Y. The third bent portion 4115 is connected to the second side surface 22 of the second circuit board 20.

Referring to FIGS. 2, 3, and 4, when the camera module 100 is working, the lens 84 shakes along the first direction X, the first circuit board 10 controls the memory wire assembly 50 to drive the second circuit board 20 to move along the first direction X, and the second circuit board 20 drives the second movable portions 4114 of the plurality of the metal strips 411 (such as an area corresponding to the square dotted line frame shown in FIG. 4) to be elastically deformed in the first direction X. So that the central axis of the photosensitive chip 30 coincides with the optical axis of the lens 84, thereby compensating for the optical shake of the lens 84 in the first direction X. When the lens 84 shakes along the second direction Y, the first circuit board 10 controls the memory wire assembly 50 to drive the second circuit board 20 to move along the second direction Y, and the second circuit board 20 drives the first movable portions 4112 of the plurality of the metal strips 411 (such as an area corresponding to the oval-shaped dotted line frame shown in FIG. 4) to be elastically deformed in the second direction Y. So that the central axis of the photosensitive chip 30 coincides with the optical axis of the lens 84, thereby compensating for the optical shake of the lens 84 in the second direction Y.

Since the first movable portion 4112 and the second movable portion 4114 are arranged at an included angle of 90°, when the metal strips 411 moves in the first direction X or in the second direction Y, only the corresponding second movable portions 4114 or the corresponding first movable portions 4112 is driven to be elastically deformed, so that no large reaction force is generated on the second circuit board 20, thereby improving the flexibility of the memory wire assembly 50 to drive the second circuit board 20 to move. At the same time, when the circuit board 20 moves along the first direction X or along the second direction Y, the first bent portions 4111 and the third bent portions 4115 are respectively used to buffer the joint of the metal strip 411 and the second circuit board 20 and the joint of the metal strip 411 and the first circuit board 10, thereby preventing the joints from tearing.

Referring to FIGS. 3 and 4, in at least one embodiment, the first connecting members 41 may be centrally symmetric with respect to a center of the second connecting members 42, the second connecting members 42 may be centrally symmetric with respect to a center of the first connecting members 41. In at least one embodiment, after the first connecting members 41 is rotated by 90° around a center of the second circuit board 20, the first connecting members 41 and the second connecting members 42 may be overlapped. The first connecting members 41 and the second connecting members 42 may form a substantially "swastika"-shaped structure, which can further improve the stability of the movement of the second circuit board 20 and the movement of the photosensitive chip 30 when the memory metal wire assembly 50 drives the second circuit board 20 to move.

Driven by the memory metal wire assembly 50, when the second circuit board 20 moves along the first direction X, the second movable portions 4114 of the first connecting members 41 and the second movable portions 4114 of the second connecting members 42 (such as the areas corresponding to the square dotted line frame shown in FIG. 4) are elastically deformed. When the second circuit board 20 moves along the second direction Y, the first movable portions 4112 of the first connecting members 41 and the first movable portions 4112 of the second connecting members 42 (such as the areas corresponding to the square dotted line frame shown in FIG. 4) are elastically deformed.

Figure 5:
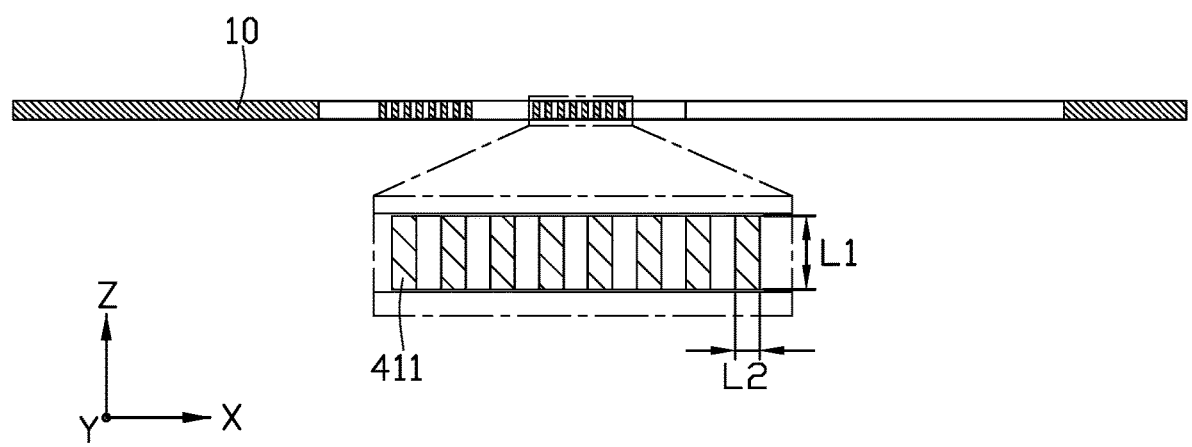
FIG. 5 is a cross-sectional view of an embodiment of a partial structure of the camera module taken along V-V line of FIG. 3.

Referring to FIGS. 4 and 5, the through groove 11 in the first circuit board 10 may be substantially square, the second circuit board 20 may be located at the center of the through groove 11. The inner surface 110 includes a first inner wall 111, a second inner wall 112, a third inner wall 113, and a fourth inner wall 114 which are connected end to end. The first side surface 21 faces the first inner wall 111, the second side surface 22 faces the second inner wall 112, the third side surface 23 faces the third inner wall 113, and the fourth side surface 24 faces the fourth inner wall 114. The second inner wall 112 is spaced apart from the fourth inner wall 114 along the first direction X, the first inner wall 111 is spaced apart from the third side surface 23 along the second direction Y. The first bent portion 4111 is connected to the first inner wall 111, the third bent portion 4115 is connected to the second side surface 22 of the second circuit board 20. Compared with the third bent portion 4115 being directly connected to the first side surface 21, the third bent portion 4115 is connected to the second side surface 22, which not only helps to reduce the size of the gap 12 or increase the activity space of the electrical connecting assembly 40, but also helps to reduce an acting force on the second bent portion 4113, and further reduce an acting force of the memory metal wire assembly 50 on the second circuit board 20.

Meanwhile, compared with the metal strips 411 being connected to an bottom of the second circuit board 20, the third bent portions 4115 of the metal strips 411 are connected to all side surfaces of the second circuit board 20, which not only helps to reduce the length of each of the metal strips 411, but also helps to shorten the distance between the second circuit board 20 and the photosensitive chip 30. So that it is beneficial to the development of the lightness and the thinness of the camera module 100.

Referring to FIG. 4, in at least one embodiment, the first inner wall 111 includes a connecting area 1111, and the connecting area 1111 is a partial area of the first inner wall 11 close to the fourth inner wall 114. The first bent portions 4111 are connected to the connecting area 1111, which is beneficial to provide space for increasing the length of the first movable portions 4112. So that when the second circuit board 20 moves along the second direction Y, the flexibility of the movement of the second movable portions 4114 is increased, the tearing of the first bent portions 4111 is reduced, and the acting force of the memory metal wire assembly 50 on the second circuit board 20 is reduced.

Referring to FIGS. 4 and 5, in at least one embodiment, in a cross section perpendicular to the second direction Y, a length L1 of each of the metal strips 411 in the third direction Z is greater than a length L2 of the corresponding metal strip 411 in the first direction X. when the memory metal wire assembly 50 drives the second circuit board 20 and the electrical connecting assembly 40 to move at the same time, since L1 is greater than L2, the movement of each of the metal strips 411 in the third direction Z can be suppressed, and each of the metal strips 411 can be prevented from be lifted in the third direction Z, so as to prevent the stability of the movement of the second circuit board 20 from being affected. In at least one embodiment, a cross section of each of the metal strips 411 perpendicular to the second direction Y is a square. In at least one embodiment, the cross section of each of the metal strips 411 may be a trapezoid, a hexagon or other regular polygons.

In at least one embodiment, each of the metal strips 411 may be made of copper, silver, gold, aluminum, or alloys thereof. Preferably, each of the metal strips 411 is made of copper. In at least one embodiment, the metal strips 411 may be made by etching.

Figure 6:
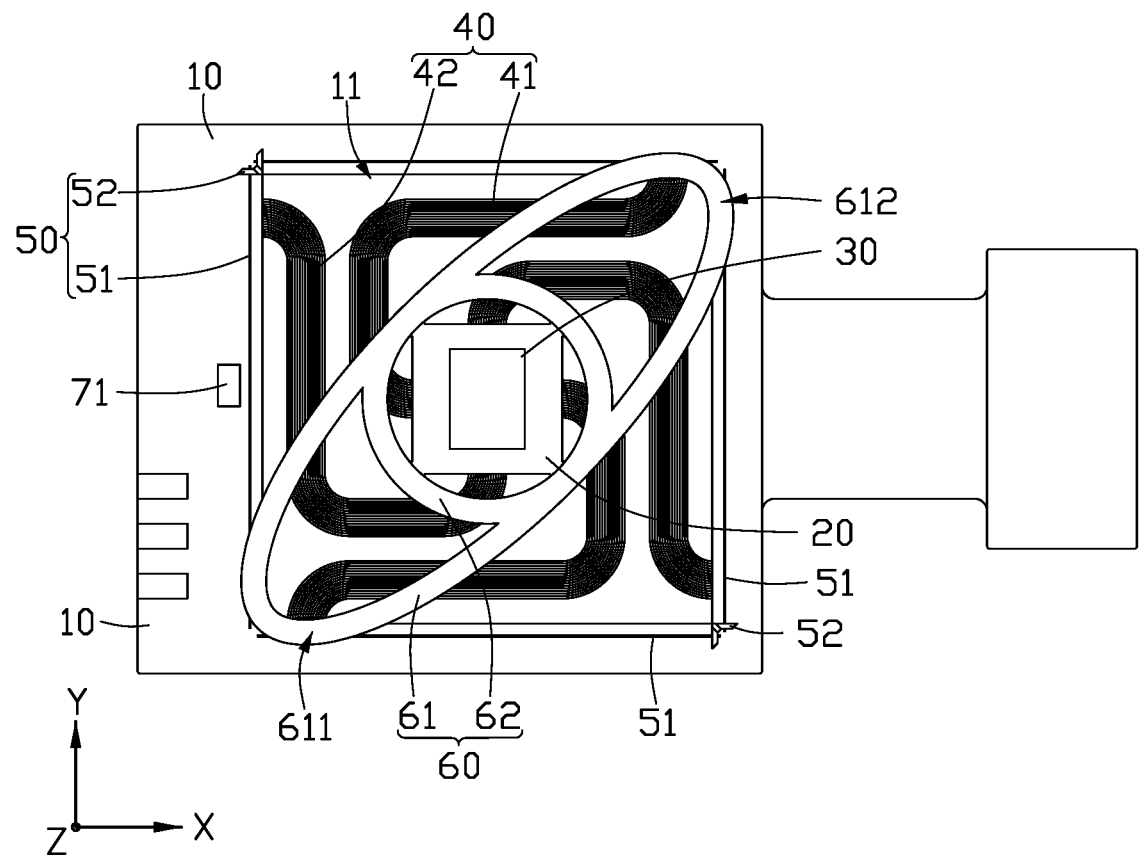
FIG. 6 is a diagram of an embodiment of a partial structure of a camera module according to the present disclosure.
Figure 7:
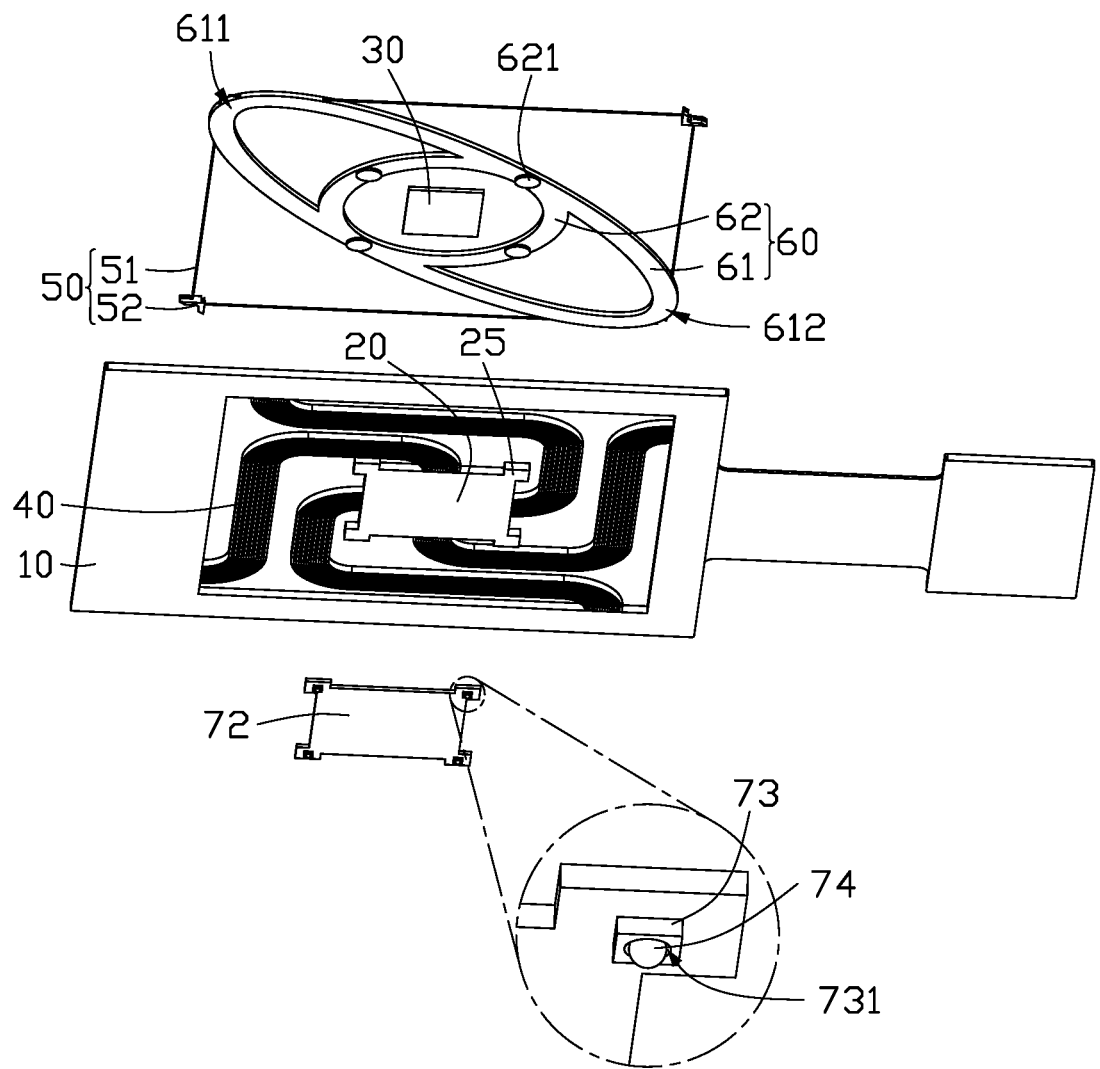
FIG. 7 is an exploded, diagrammatic view of an embodiment of a partial structure of a camera module according to the present disclosure.

Referring to FIGS. 6 and 7, in at least one embodiment, the camera module 100 may further include a transmission member 60. The transmission member 60 is fixed on the second circuit board 20 and is electrically connected to the second circuit board 20 and the memory wire assembly 50. The memory wire assembly 50 drives the second circuit board 20 to move through the transmission member 60.

In at least one embodiment, the transmission member 60 includes a supporting ring 61, and the supporting ring 61 includes a first end portion 611 and a second end portion 612 opposite to the first end portion 611. The supporting ring 61 may have a substantially oval structure. A distance between the first end portion 611 and the second end portion 612 is the maximum length of the supporting ring 61. Along the third direction Z, projections of the first end portion 611 and the second end portion 612 are located on the first circuit board 10, and a plane of the supporting ring 61 is parallel to the plane formed by the first direction X and the second direction Y. so that the supporting ring 61 ensures that the second circuit board 20 can move in the plane formed by the first direction X and the second direction Y.

In at least one embodiment, the memory metal wire assembly 50 may include four memory wires 51 and two fixing clips 52. The fixing clips 52 are fixed on the first circuit board 10 and are electrically connected to the first circuit board 10. The fixing clips 52 are symmetrical with respect to the supporting ring 61. One end of each of the memory wires 51 is fixed by the fixing clip 52, and the other end of each of the memory wires 51 is fixed at the first end portion 611 or the second end portion 612. The memory wires 51 are arranged close to and surround the through groove 11. Two of the memory wires 51 may extend along the first direction X, and the other memory wires 51 extend along the second direction Y. Each of the memory wires 51 is electrically connected to an external circuit (not shown). After power-on, by increasing the resistance of the external circuit, the memory wires 51 is heated to elastically deform in the first direction X and/or in the second direction Y, thereby driving the supporting ring 61 to drive the second circuit board 20 to move. The first circuit board 10, the fixing clips 52, the memory wires 51, the transmission member 60, the second circuit board 20, and the electrical connecting assembly 40 form a closed circuit loop.

In at least one embodiment, the memory wire 51 is connected to the first end portion 611 or the second end portion 612 by winding clamping, or threading, so as to improve a contact area between the memory wire 51 and the first end portion 611 or a contact area between the memory wire 51 and the second end portion 612, and improve a support for the memory wire 51.

Referring to FIGS. 6 and 7, in at least one embodiment, a thermistor 71 may be arranged on the first circuit board 10. The thermistor 71 is electrically connected to the first circuit board 10 and is close to the memory wires 51. The thermistor 71 is configured to monitor a temperature of the memory wires 51 and timely feedback a change of the temperature of the memory wires 51 to the first circuit board 10, so that the first circuit board 10 can accurately control the movement of the second circuit board 20 through the memory wires 51.

Referring to FIGS. 6 and 7, in at least one embodiment, the transmission member 60 may further include a fixing ring 62 arranged in the supporting ring 61. The fixing ring 62 is arranged concentrically with the supporting ring 61. A plurality of protrusions 621 are arranged on a surface of the fixing ring 62 facing the second circuit board 20. The second circuit board 20 may further include a plurality of extending portions 25, each of the plurality of protrusions 621 corresponds to one of the plurality of extending portions 25. The fixing ring 62 is fixed on the plurality of extending portions 25 through the plurality of protrusions 621. The photosensitive chip 30 is located in the fixing ring 62. A cooperation between the fixing ring 62 and the supporting ring 61 can improve a structural strength of the transmission member 60 for supporting the memory wires 51. In at least one embodiment, four extending portions 25 are respectively arranged at the corners of the second circuit board 20, which can not only ensure the smoothness of the movement of the second circuit board 20 driven by the transmission member 60, but also avoid interference with the movement of the electrical connecting assembly 40.

In at least one embodiment, a conductive glue (not shown) may be sandwiched between the plurality of protrusions 621 and the plurality of extending portions 25. In at least one embodiment, a conductive glue (not shown) may be sandwiched between the fixing clips 52 and the first circuit board 10.

Figure 8:
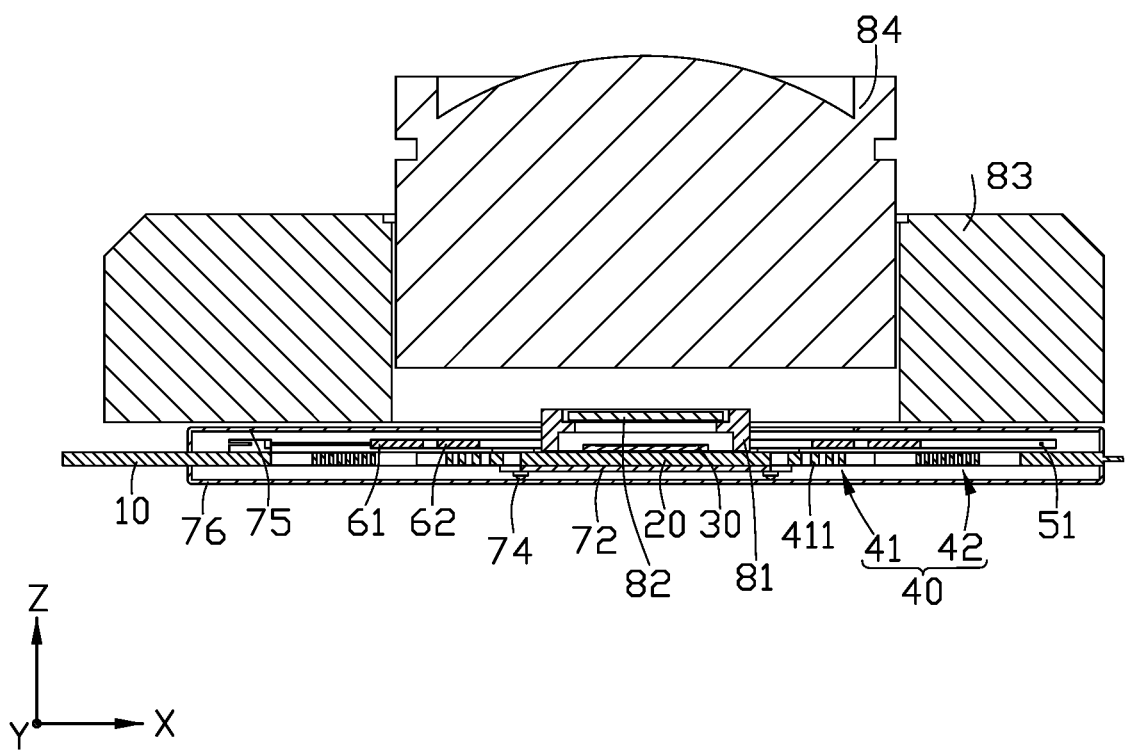
FIG. 8 is a cross-sectional view of an embodiment of a camera module taken along VIII-VIII line of FIG. 1.

Referring to FIGS. 7 and 8, in at least one embodiment, the camera module 100 may further include a reinforcing plate 72. The reinforcing plate 72 is arranged on a side of the second circuit board 20 facing away from the photosensitive chip 30 to enhance a structural strength of the second circuit board 20.

Referring to FIGS. 2 and 8, in at least one embodiment, a first protection board 75 and a second protection board 76 may further arranged opposite sides of the second circuit board 2, respectively. The first protection board 75 includes through hole 751, and a size of the through hole 751 corresponds to a size of the fixing ring 62. In at least one embodiment, the through hole 751 is substantially a square hole. An edge of the first protection board 75 and an edge of the second protection board 76 are fixed on the first circuit board 10 to protect the electrical connecting assembly 40 and the memory metal wire assembly 50 from external interference.

At the same time, the heat generated by the photosensitive chip 30 after working for a period of time can be transferred to the plurality of metal strips 411 and the reinforcing plate 72 via the second circuit board 20 to improve the heat dissipation efficiency of the photosensitive chip 30.

Referring to FIGS. 2 and 7, in at least one embodiment, the camera module 100 may further include a plurality of stop blocks 73 and a plurality of balls 74. The plurality of stop blocks 73 are fixed on a surface of the reinforcing plate 72 facing away from the second circuit board 20. Each of the plurality of stop blocks 73 includes a limiting slot 731 for receiving one of the plurality of balls 74. Each of the plurality of balls 74 is rotatablely received in one of the limiting slots 731 of the plurality of stop blocks 73 and protrudes from the corresponding stop block 73. In at least one embodiment, the camera module 100 includes four balls 74. Each of the balls 74 are slidably arranged on the second protection board 76, not only supporting the reinforcing plate 72 on the second protection board 76, but also improving the flexibility of the second circuit board 20 to move along the first direction X or the second direction Y. In at least one embodiment, a surface of the first protection board 75 facing the first circuit board 10 and a surface of the second protection board 76 facing the first circuit board 10 are coated with insulating layers (not shown).

Referring to FIGS. 2 and 8, in at least one embodiment, the camera module 100 may further include a mounting frame 81, an optical filter 82, and a voice coil motor 83. The mounting frame 81 includes a mounting groove 811, the optical filter 82 is received and fixed in the mounting groove 811. The mounting frame 81 is adhered and fixed on the second circuit board 20. The voice coil motor 83 is mounted on the first protection board 75, the lens 84 is mounted on the voice coil motor 83. The voice coil motor 83 drives the lens 84 to move along the third direction Z to achieve focus adjustment of the camera module 100.

Figure 9:
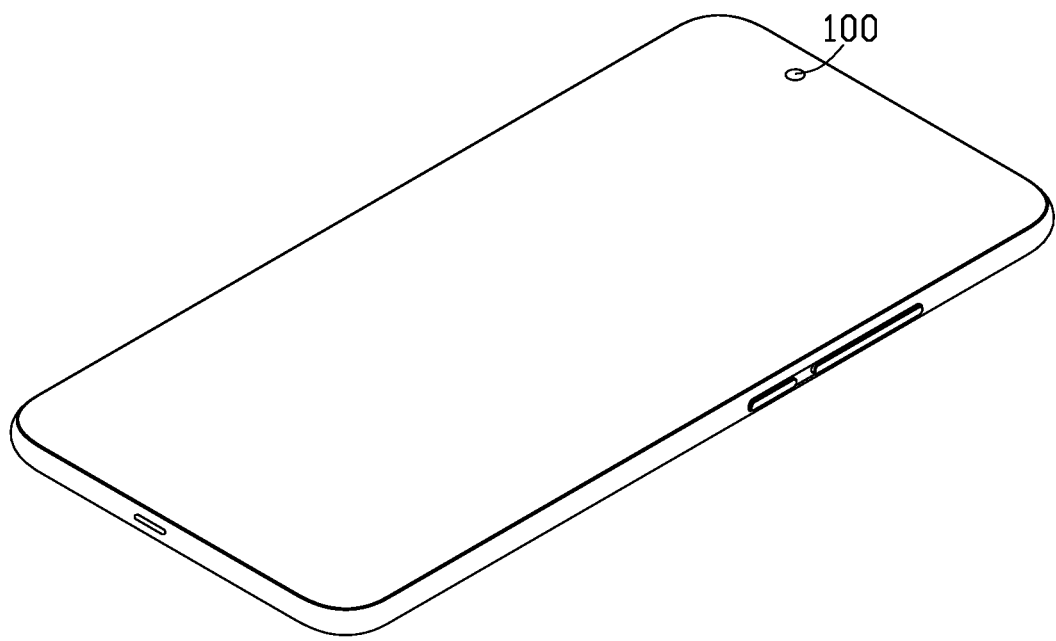
FIG. 9 is a diagram of an embodiment of an electronic device according to the present disclosure.

FIG. 9 illustrates an embodiment of an electronic device 200. The above camera module 100 is applied to the electronic device 200. The electronic device 200 may be, but not limited to, a mobile phone, a wearable device, a computer device, a vehicle or a monitoring device. In at least one embodiment, the electronic device 200 is a mobile phone.

In the present disclosure, when the camera module 100 is working, if the lens 84 shakes, the memory metal wire assembly 50 drives the photosensitive chip 30 and the electrical connecting assembly 40 to move in the plane formed by the first direction X and the second direction Y at the same time, so that the central axis of the photosensitive chip 30 overlaps with the optical axis of the lens 84, thereby compensating for the shake of the lens 84. The structure of the camera module 100 is simple, and the camera module 100 is easy to assemble. The arrangement of the two center-symmetrical first connecting members 41 and the two center-symmetrical second connecting members 42 can improve the stability of the photosensitive chip 30 when the photosensitive chip 30 moves in the first direction X or in the second direction Y, and prevent the photosensitive chip 30 from tilting or offset.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A camera module comprising:
    a first circuit board, wherein a through groove is defined by an inner surface of the first circuit board, the inner surface comprises a first inner wall, a second inner wall, a third inner wall, and a fourth inner wall which are connected end to end;
    a lens on the first circuit board;
    a second circuit board in the through groove and a gap spacing the second circuit board and the inner surface, wherein the second circuit board comprises a first side surface, a second side surface, a third side surface, and a fourth side surface, the second side surface and the third side surface are spaced from each other and both connected between the first side surface and the fourth side surface, the first side surface faces the first inner wall, the second side surface faces the second inner wall, the third side surface faces the third inner wall, the fourth side surface faces the fourth inner wall;
    a photosensitive chip on the second circuit board, and a plane formed by a first direction and a second direction perpendicular to the first direction, wherein the plane is parallel to a plane where the photosensitive chip is located;
    an electrical connecting assembly located in the gap and electrically connected to the first circuit board and the second circuit board, wherein the electrical connecting assembly comprises two center-symmetrical first connecting members and two center-symmetrical second connecting members; one of the center-symmetrical first connecting members is connected the first inner wall and the second side surface, another of the center-symmetrical first connecting members is connected to the third inner wall and the fourth side surface; one of the two center-symmetrical second connecting members is connected to the second inner wall and the third side surface, another of the two center-symmetrical second connecting members is connected to the fourth inner wall and the first side surface; and
    a memory metal wire assembly on the first circuit board and electrically connected to the first circuit board, wherein the memory metal wire assembly is further electrically connected to the second circuit board to drive the photosensitive chip to move in the plane the photosensitive chip is located through the electrical connecting assembly.

2. The camera module of claim 1, wherein the two center-symmetrical first connecting members are centrally symmetric with respect to a center of the two center-symmetrical second connecting members, the two center-symmetrical second connecting members are centrally symmetric with respect to a center of the two center-symmetrical first connecting members.

3. The camera module of claim 1, wherein the second side surface is spaced from the fourth side surface, the first direction is perpendicular to the second side surface and the fourth side surface, the third side surface is spaced from the first side surface, the second direction is perpendicular to the third side surface and the first side surface; each of the two center-symmetrical first connecting members comprises a plurality of metal strips, each of the plurality of metal strips comprises a first bent portion, a first movable portion, a second bent portion, a second movable portion, and a third bent portion which are connected in that sequence, the first bent portion is connected to the first inner wall or the third inner wall, the first movable portion is arranged along the first direction, the second bent portion is connected to the first movable portion and the second movable portion, the second movable portion is arranged along the second direction, the third bent portion is connected to the second side surface or the fourth side surface.

4. The camera module of claim 3, wherein the first inner wall comprises a connecting area, the connecting area is a partial area of the first inner wall close to the fourth inner wall, the first bent portion is connected to the connecting area.

5. The camera module of claim 3, wherein a direction perpendicular to the first direction and the second direction is defined as a third direction, in a cross section perpendicular to the second direction, a length of each of the plurality of metal strips in the third direction is greater than a length of each of the plurality of metal strips in the third direction.

6. The camera module of claim 1, wherein the camera module further comprises a transmission member, the transmission member is fixed on the second circuit board and the transmission member is electrically connected to the second circuit board and the memory wire assembly.

7. The camera module of claim 6, wherein the transmission member comprises a supporting ring fixed on the second circuit board, the supporting ring comprises a first end portion and a second end portion opposite to the first end portion, the first end portion and the second end portion are located on the first circuit board, the memory metal wire assembly comprises four memory wires and two fixing clips, the fixing clips are fixed on the first circuit board and are electrically connected to the first circuit board, the fixing clips are symmetrical with respect to the supporting ring; one end of each of the memory wires is fixed by the fixing clip, and the other end of each of the memory wires is fixed at the first end portion or the second end portion.

8. The camera module of claim 7, wherein the transmission member further comprises a fixing ring arranged in the supporting ring, the fixing ring is fixed on the second circuit board.

9. The camera module of claim 8, wherein the fixing ring is arranged concentrically with the supporting ring.

10. The camera module of claim 1, wherein the camera module further comprises a reinforcing plate, the reinforcing plate is arranged on a side of the second circuit board facing away from the photosensitive chip.

11. An electronic device comprising:
a camera module comprising:
a first circuit board, wherein a through groove is defined by an inner surface of the first circuit board, the inner surface comprises a first inner wall, a second inner wall, a third inner wall, and a fourth inner wall which are connected end to end;
a lens on the first circuit board;
a second circuit board in the through groove and a gap spacing the second circuit board and the inner surface, wherein the second circuit board comprises a first side surface, a second side surface, a third side surface, and a fourth side surface, the second side surface and the third side surface are spaced from each other and both connected between the first side surface and the fourth side surface, the first side surface faces the first inner wall, the second side surface faces the second inner wall, the third side surface faces the third inner wall, the fourth side surface faces the fourth inner wall;
a photosensitive chip on the second circuit board, and a plane formed by a first direction and a second direction perpendicular to the first direction, wherein the plane is parallel to a plane where the photosensitive chip is located;
an electrical connecting assembly located in the gap and electrically connected to the first circuit board and the second circuit board, wherein the electrical connecting assembly comprises two center-symmetrical first connecting members and two center-symmetrical second connecting members; one of the center-symmetrical first connecting members is connected the first inner wall and the second side surface, another of the center-symmetrical first connecting members is connected to the third inner wall and the fourth side surface; one of the two center-symmetrical second connecting members is connected to the second inner wall and the third side surface, another of the two center-symmetrical second connecting members is connected to the fourth inner wall and the first side surface; and
a memory metal wire assembly on the first circuit board and electrically connected to the first circuit board, wherein the memory metal wire assembly is further electrically connected to the second circuit board to drive the photosensitive chip to move in the plane the photosensitive chip is located through the electrical connecting assembly.

12. The electronic device of claim 11, wherein the two center-symmetrical first connecting members are centrally symmetric with respect to a center of the two center-symmetrical second connecting members, the two center-symmetrical second connecting members are centrally symmetric with respect to a center of the two center-symmetrical first connecting members.

13. The electronic device of claim 11, wherein the second side surface is spaced from the fourth side surface, the first direction is perpendicular to the second side surface and the fourth side surface, the third side surface is spaced from the first side surface, the second direction is perpendicular to the third side surface and the first side surface; each of the two center-symmetrical first connecting members comprises a plurality of metal strips, each of the plurality of metal strips comprises a first bent portion, a first movable portion, a second bent portion, a second movable portion, and a third bent portion which are connected in that sequence, the first bent portion is connected to the first inner wall or the third inner wall, the first movable portion is arranged along the first direction, the second bent portion is connected to the first movable portion and the second movable portion, the second movable portion is arranged along the second direction, the third bent portion is connected to the second side surface or the fourth side surface.

14. The electronic device of claim 13, wherein the first inner wall comprises a connecting area, the connecting area is a partial area of the first inner wall close to the fourth inner wall, the first bent portion is connected to the connecting area.

15. The electronic device of claim 13, wherein a direction perpendicular to the first direction and the second direction is defined as a third direction, in a cross section perpendicular to the second direction, a length of each of the plurality of metal strips in the third direction is greater than a length of each of the plurality of metal strips in the third direction.

16. The electronic device of claim 11, wherein the camera module further comprises a transmission member, the transmission member is fixed on the second circuit board and the transmission member is electrically connected to the second circuit board and the memory wire assembly.

17. The electronic device of claim 16, wherein the transmission member comprises a supporting ring fixed on the second circuit board, the supporting ring comprises a first end portion and a second end portion opposite to the first end portion, the first end portion and the second end portion are located on the first circuit board, the memory metal wire assembly comprises four memory wires and two fixing clips, the fixing clips are fixed on the first circuit board and are electrically connected to the first circuit board, the fixing clips are symmetrical with respect to the supporting ring; one end of each of the memory wires is fixed by the fixing clip, and the other end of each of the memory wires is fixed at the first end portion or the second end portion.

18. The electronic device of claim 17, wherein the transmission member further comprises a fixing ring arranged in the supporting ring, the fixing ring is fixed on the second circuit board.

19. The electronic device of claim 18, wherein the fixing ring is arranged concentrically with the supporting ring.

20. The electronic device of claim 11, wherein the camera module further comprises a reinforcing plate, the reinforcing plate is arranged on a side of the second circuit board facing away from the photosensitive chip.

\* \* \* \* \*